United States Patent
Hack et al.

(10) Patent No.: US 11,502,134 B2
(45) Date of Patent: Nov. 15, 2022

(54) LOW POWER CONSUMPTION OLED DISPLAY

(71) Applicant: Universal Display Corporation, Ewing, NJ (US)

(72) Inventors: Michael Hack, Carmel, CA (US); Julia J. Brown, Yardley, PA (US); Michael Stuart Weaver, Princeton, NJ (US); Woo-Young So, Richboro, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 16/807,200

(22) Filed: Mar. 3, 2020

(65) Prior Publication Data

US 2020/0203439 A1 Jun. 25, 2020

Related U.S. Application Data

(63) Continuation of application No. 14/605,757, filed on Jan. 26, 2015, now Pat. No. 10,700,134.

(60) Provisional application No. 62/068,281, filed on Oct. 24, 2014, provisional application No. 62/026,494, filed on Jul. 18, 2014, provisional application No. 62/005,343, filed on May 30, 2014, provisional application No. 62/003,269, filed on May 27, 2014.

(51) Int. Cl.
*H01L 27/32* (2006.01)

(52) U.S. Cl.
CPC ........ *H01L 27/3211* (2013.01); *H01L 27/322* (2013.01); *H01L 27/3213* (2013.01); *H01L 27/3227* (2013.01); *H01L 27/3244* (2013.01)

(58) Field of Classification Search
CPC .............. H01L 27/3276; H01L 27/322; H01L 2251/5338; H01L 27/3213; H01L 27/3216; H01L 2251/5376
See application file for complete search history.

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| CN | 1689064 A | 10/2005 |
| CN | 101874317 A | 10/2010 |

(Continued)

OTHER PUBLICATIONS

Korean Office Action (including English translation) for App. No. KR10-2020-0079647, dated Oct. 28, 2020, 14 pages.
Japanese Pre-Appeal Report (with English language translation) for App. No. JP2019-007571, dated Sep. 11, 2020, 11 pages.

(Continued)

*Primary Examiner* — Marcos D. Pizarro
*Assistant Examiner* — Quinton A Brasfield
(74) *Attorney, Agent, or Firm* — Butzel Long

(57) ABSTRACT

This disclosure relates to reduced power consumption OLED displays at reduced cost for reduced information content applications, such as wearable displays. Image quality for wearable displays can be different than for high information content smart phone displays and TVs, where the wearable display has an architecture that in includes, for example, an all phosphorescent device and/or material system that may be fabricated at reduced cost. The reduced power consumption can facilitate wireless and solar charging.

37 Claims, 4 Drawing Sheets

(56) References Cited

U.S. PATENT DOCUMENTS

| | | | |
|---|---|---|---|
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,280,559 B1 | 8/2001 | Terada | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,038,373 B2 | 5/2006 | Arnold | |
| 7,279,704 B2 | 10/2007 | Walters | |
| 7,431,968 B1 | 10/2008 | Shtein | |
| 7,714,500 B2 | 5/2010 | Hirakata | |
| 7,968,146 B2 | 6/2011 | Wagner | |
| 7,982,385 B2 | 7/2011 | Kimura | |
| 8,040,052 B2 | 10/2011 | Kobayashi | |
| 8,084,940 B2 | 12/2011 | Kim | |
| 8,159,426 B2 | 4/2012 | Chang | |
| 8,400,018 B2 | 3/2013 | Joannopoulos | |
| 8,502,445 B2 | 8/2013 | Levermore | |
| 8,766,531 B1 | 7/2014 | Hack | |
| 8,896,200 B2 | 11/2014 | Huang | |
| 2003/0042848 A1* | 3/2003 | Park | H01L 51/5016 313/503 |
| 2003/0160915 A1 | 8/2003 | Liu | |
| 2003/0178936 A1 | 9/2003 | Park | |
| 2003/0230980 A1 | 12/2003 | Forrest | |
| 2004/0061107 A1 | 4/2004 | Duggal | |
| 2004/0174116 A1 | 9/2004 | Lu | |
| 2005/0225232 A1 | 10/2005 | Boroson | |
| 2005/0242717 A1 | 11/2005 | Bae | |
| 2006/0044226 A1 | 3/2006 | Liedenbaum | |
| 2006/0238118 A1 | 10/2006 | Spindler | |
| 2006/0238120 A1 | 10/2006 | Miller | |
| 2007/0052354 A1 | 3/2007 | Chang | |
| 2007/0063946 A1* | 3/2007 | Nakamura | G02F 1/133514 345/88 |
| 2007/0205423 A1* | 9/2007 | Yamazaki | H01L 27/3213 428/917 |
| 2007/0257944 A1 | 11/2007 | Miller | |
| 2007/0273295 A1 | 11/2007 | Wakabayashi | |
| 2007/0279372 A1 | 12/2007 | Brown Elliott | |
| 2008/0198180 A1 | 8/2008 | Langendijk | |
| 2008/0203905 A1* | 8/2008 | Je | H01L 51/0054 564/426 |
| 2009/0051283 A1 | 2/2009 | Cok | |
| 2009/0085478 A1 | 4/2009 | Cok | |
| 2009/0091238 A1 | 4/2009 | Cok | |
| 2009/0092325 A1 | 4/2009 | Brown Elliott | |
| 2009/0102352 A1 | 4/2009 | Cok | |
| 2009/0109172 A1 | 4/2009 | Lee | |
| 2009/0121983 A1 | 5/2009 | Sung | |
| 2009/0189881 A1 | 7/2009 | Ooishi | |
| 2009/0295283 A1 | 12/2009 | Kim | |
| 2010/0053043 A1 | 3/2010 | Sakamoto | |
| 2010/0090620 A1 | 4/2010 | Hack | |
| 2010/0103187 A1 | 4/2010 | Linssen | |
| 2010/0187988 A1 | 7/2010 | Forrest | |
| 2010/0219427 A1 | 9/2010 | Fukuda | |
| 2010/0231484 A1 | 9/2010 | Cok | |
| 2010/0244069 A1* | 9/2010 | Weaver | H01L 51/5012 257/98 |
| 2011/0062427 A1 | 3/2011 | Jeong | |
| 2011/0095276 A1 | 4/2011 | Imai | |
| 2011/0096530 A1 | 4/2011 | Shimizu | |
| 2011/0248294 A1* | 10/2011 | Weaver | H01L 27/3213 257/89 |
| 2011/0309389 A1* | 12/2011 | Yu | H01L 27/322 257/89 |
| 2012/0001207 A1 | 1/2012 | Lee | |
| 2012/0026210 A1* | 2/2012 | Yano | G09G 3/3607 345/87 |
| 2012/0075278 A1 | 3/2012 | Hara | |
| 2012/0147065 A1 | 6/2012 | Byun | |
| 2012/0287605 A1 | 11/2012 | Chen | |
| 2012/0313843 A1 | 12/2012 | Kondoh | |
| 2013/0020933 A1 | 1/2013 | Levermore | |
| 2013/0082589 A1 | 4/2013 | So | |
| 2013/0105777 A1 | 5/2013 | Adamovich | |
| 2013/0105778 A1 | 5/2013 | Kim | |
| 2013/0105833 A1 | 5/2013 | Weaver | |
| 2013/0146853 A1 | 6/2013 | Lee | |
| 2013/0146904 A1* | 6/2013 | Edmond | H01L 33/08 257/88 |
| 2013/0187132 A1 | 7/2013 | Ando | |
| 2013/0235094 A1* | 9/2013 | Cok | G09G 5/02 345/694 |
| 2013/0285537 A1 | 10/2013 | Chaji | |
| 2013/0337588 A1 | 12/2013 | Lee | |
| 2014/0061595 A1 | 3/2014 | Kim | |
| 2014/0065750 A1 | 3/2014 | Harikrishna Mohan | |
| 2014/0084256 A1 | 3/2014 | Kim | |
| 2014/0111406 A1 | 4/2014 | Wang | |
| 2014/0183464 A1 | 7/2014 | Baek | |
| 2014/0183471 A1 | 7/2014 | Heo | |
| 2014/0291647 A1 | 10/2014 | Suzuki | |
| 2014/0332790 A1 | 11/2014 | Fadhel | |
| 2015/0009194 A1 | 1/2015 | Kim | |
| 2015/0034911 A1* | 2/2015 | Liu | H01L 31/03921 257/40 |
| 2015/0138463 A1 | 5/2015 | Jinta | |
| 2015/0235615 A1* | 8/2015 | Yoshida | G09G 5/028 345/600 |
| 2017/0229663 A1 | 8/2017 | Tsai | |

FOREIGN PATENT DOCUMENTS

| | | |
|---|---|---|
| JP | 2000164347 A | 6/2000 |
| JP | 20070954444 A | 4/2007 |
| JP | 2007140456 | 6/2007 |
| JP | 2007317915 | 12/2007 |
| JP | 2008218300 A | 9/2008 |
| JP | 2008539554 A | 11/2008 |
| JP | 2010033905 A | 2/2010 |
| JP | 2010050014 A | 3/2010 |
| JP | 2010165510 A | 7/2010 |
| JP | 2010192366 A | 9/2010 |
| JP | 2012077069 A | 4/2012 |
| JP | 2012089513 A | 5/2012 |
| JP | 2012109576 A | 6/2012 |
| JP | 2012190029 | 10/2012 |
| JP | 2014045166 | 3/2014 |
| JP | 201459560 A | 4/2014 |
| KR | 20000073118 A | 12/2000 |
| KR | 20090021580 A | 3/2009 |
| WO | 2006115960 A1 | 11/2006 |
| WO | 2008057394 A1 | 5/2008 |
| WO | 2010011390 A2 | 1/2010 |
| WO | 2014020817 A1 | 2/2014 |

OTHER PUBLICATIONS

Chinese Office Action (with English language translation) for App No. CN201580028268.9, dated Mar. 20, 2020, 9 pages.

Zhao, Jianyong, "Organic Light Emitting Diode (OLED) Display Technology," National Defense Industry Press, published on Jul. 2012.

Zhongjian, "Liquid Crystal Display Device Technology," National Defense Industry Press, published on Feb. 2014.

Korean Office Action (including English translation) for App. No. KR10-2016-7031290, dated Apr. 26, 2021, 11 pages.

Japanese Office Action (with English language translation) for Application No. JP2019-007571, dated Mar. 31, 2020, 7 pages.

Hack, et al., "Novel Two Mask AMOLED Display Architecture", SID 2014 Digest, pp. 567-569.

Baldo et al.Highly efficient phosphorescent emission from organic electroluminescent devices, Nature, vol. 395, pp. 151-154, 1998.

(56) References Cited

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.
Wood, "MacAdam Ellipses", Protocol, 2010, 15-18.
International Search Report and Written Opinion dated Nov. 10, 2015 in corresponding International Application No. PCT/US2015/032672, Nov. 10, 2015.
Office Action dated Apr. 14, 2017 as received in CN Application No. 201410019395.X.
Office Action dated Jul. 11, 2017 as received in JP Application No. 2014-005666.
Office Action dated Feb. 14, 2017 as received in JP Application No. 2014-005666.
Notice of Allowance dated Aug. 15, 2016 as received in U.S. Appl. No. 14/243,145.
CN Office Action dated Dec. 13, 2017 in Application No. 201410019395.X, 5 pages.
Chinese Office Action dated Jun. 12, 2018 for CN Application No. 201410019395.X, 8 pages.
Chinese Office Action issued in corresponding CN Application No. 201580028268.9, dated Oct. 25, 2018, 5 pages.
Japanese Office Action (including English translation) issued in corresponding JP Application No. 2016-569684, dated Oct. 30, 2018, 9 pages.
Korean Office Action (with English language translation) for Application No. KR10-2014-0002707, dated Jun. 27, 2019, 15 pages.
Japanese Office Action (with English translation) issued in JP Application No. 2019-007571, dated Dec. 24, 2019, 9 pages.

* cited by examiner

LOW POWER CONSUMPTION OLED DISPLAY

CROSS-REFERENCE TO RELATED APPLICATIONS

This application claims the benefit of U.S. Provisional Patent Application Ser. Nos. 62/003,269, filed May 27, 2014; 62/005,343, filed May 30, 2014; 62/026,494, filed Jul. 18, 2014; and 62/068,281, filed Oct. 24, 2014, the disclosure of each of which is incorporated by reference in its entirety. This application also claims the benefit of U.S. patent application Ser. No. 14/605,757, filed Jan. 26, 2015, the disclosure of which is incorporated by reference in its entirety. This application is related to U.S. patent application Ser. Nos. 14/605,876 and 14/605,748, both filed on Jan. 26, 2015, the entire contents of which are incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting diodes (OLED), and, in particular, reduced power OLED displays having red, green, and light blue sub-pixels, the displays being flexible, daylight readable, and wirelessly chargeable.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted $Ir(ppy)_3$, which has the following structure:

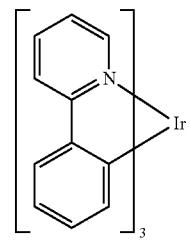

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

Layers, materials, regions, and devices may be described herein in reference to the color of light they emit. In general, as used herein, an emissive region that is described as producing a specific color of light may include one or more emissive layers disposed over each other in a stack.

As used herein, a "red" layer, material, or device refers to one that emits light in the range of about 580-700 nm; a "green" layer, material, or device refers to one that has an emission spectrum with a peak wavelength in the range of about 500-600 nm; a "blue" layer, material, or device refers to one that has an emission spectrum with a peak wavelength in the range of about 400-500 nm. In some arrangements, separate regions, layers, materials, or devices may provide separate "deep blue" and a "light blue" light. As used herein, in arrangements that provide separate "light blue" and "deep blue", the "deep blue" component refers to one having a peak emission wavelength that is at least about 4 nm less than the peak emission wavelength of the "light blue" component. Typically, a "light blue" component has a peak emission wavelength in the range of about 465-500 nm, and a "deep blue" component has a peak emission wavelength in the range of about 400-470 nm, though these ranges may vary for some configurations. Similarly, a color altering layer refers to a layer that converts or modifies another color of light to light having a wavelength as specified for that color. For example, a "red" color filter refers to a filter that results in light having a wavelength in the range of about 580-700 nm. In general there are two classes of color altering layers: color filters that modify a spectrum by removing unwanted wavelengths of light, and color changing layers that convert photons of higher energy to lower energy.

More details on OLEDs, and the definitions described above, can be found in U.S. Pat. No. 7,279,704, which is incorporated herein by reference in its entirety.

SUMMARY OF THE INVENTION

Embodiments of the disclosed subject matter provide a device having an active-matrix driven display including a plurality of OLED pixels, each OLED pixel having a first sub-pixel configured to emit light in the light blue range of the visible spectrum, where each pixel comprises no other sub-pixels that emit light in a blue range of the visible spectrum. Each of the plurality of OLED pixels can further include a second sub-pixel configured to emit red light and a third sub-pixel configured to emit green light. Alternatively or in addition, the plurality of OLED sub-pixels can include a second sub-pixel configured to emit yellow light. At least one color change layer disposed over the second sub-pixel, the color change layer selected from the group consisting of: a color filter and a color conversion layer.

The device can include a wearable device, a watch, a computer, a health monitor, a head mounted display, virtual reality glasses, smart glasses, or a communication device. The wearable device including the display disclosed herein may have touch functionality (e.g., a touchscreen).

A selected white point can be within a 7-step, 3-step, or 1-step MacAdam ellipse of a Planckian Black Body Locus. The plurality of sub-pixels of the device can be configured to emit light having a white point color temperature of less than 3000K. Alternatively or in addition, the plurality of sub-pixels of the device can be configured to emit light having a white point color temperature of less than 4000K. Alternatively or in addition, the plurality of sub-pixels can be configured to emit light having a white point color temperature of less than 5000K.

The power consumed by the active-matrix driven display including the plurality of OLED pixels can be less than 6 mW/cm$^2$ when the display is operated at a luminance of at least 700 cd/m$^2$, excluding driving circuitry external to the active-matrix display.

The power consumed by the active-matrix driven display including the plurality of OLED pixels when divided by the luminance in cd/m$^2$ is less than 0.08 W/cd, excluding driving circuitry external to the active-matrix display.

The light emitted in the light blue range of the display of the device can have a y-coordinate of greater than 0.15 in CIE 1931 XYZ color space chromaticity. Alternatively or in addition, the light emitted in the light blue range can have a y-coordinate of greater than 0.2 in CIE 1931 XYZ color space chromaticity. Alternatively or in addition, the light emitted in the light blue range can have a y-coordinate of greater than 0.25 in CIE 1931 XYZ color space chromaticity. The light emitted in the light blue range can have a y-coordinate of greater than 0.3 in CIE 1931 XYZ color space chromaticity.

When the device is to provide luminances above a predetermined threshold level, any increase in luminance uses at least a greater proportion of red light to the light in the light blue range than used for a corresponding luminance increase below the predetermined threshold level. Alternatively or in addition, when the device is to provide luminances above a predetermined threshold level, any increase in luminance uses at least a greater proportion of green light to the light in the light blue range than used for a corresponding luminance increase below the predetermined threshold level. Alternatively or in addition, when the device is to provide luminances above a predetermined threshold level, and any increase in luminance uses at least a greater proportion of yellow light to the light in the light blue range than used for a corresponding luminance increase below the predetermined threshold level.

According to exemplary embodiments of the disclosed subject matter, each of the plurality of pixels of the device includes a solar cell configured to power at least a portion of the plurality of OLED pixels of the device. The device includes a plurality of solar cells, where the area of solar cells is less than 50% of an active area of the active-matrix driven display including the plurality of OLED pixels. The active-matrix driven display of the device can including the plurality of OLED pixels is disposed adjacent to a plurality of solar cells. The plurality of solar cells can capture at least light transmitted through the active-matrix driven display.

In exemplary embodiments of the disclosed subject matter, the first sub-pixel in the device can be phosphorescent. Alternatively or in addition, all of the plurality of OLED pixels are phosphorescent.

The device can further include an organic TFT backplane to control the active-matrix driven display including the plurality of OLED pixels.

In exemplary embodiments of the disclosed subject matter, the plurality of OLED pixels can be deposited by organic vapor jet printing (OVJP).

Each of the plurality of OLED pixels can further include a second sub-pixel configured to emit yellow light, and at least one color filter disposed over the second sub-pixel.

The device can be powered by the group consisting of motion, wireless power, and thermal energy.

The active-matrix driven display including the plurality of OLED pixels can be a three-dimensional (3D) display.

In embodiments of the disclosed subject matter, a plurality of solar cells can be integrated with the plurality of OLED pixels in the active-matrix driven display.

The first sub-pixel of the device can include a plurality of emissive regions arranged in a vertical stack.

The active-matrix driven display can be flexible, transparent, or conformable.

According to another embodiment, a first device comprising a first organic light emitting device is also provided. The first organic light emitting device can include an anode, a cathode, and an organic layer, disposed between the anode and the cathode. The organic layer can include a plurality of OLED pixels, each OLED pixel having a first sub-pixel configured to emit light in the light blue range of the visible spectrum, where each pixel comprises no other sub-pixels that emit light in a blue range of the visible spectrum. The first device can be a consumer product, an organic light-emitting device, and/or a lighting panel.

Embodiments of the disclosed subject matter provide a device having an active-matrix driven display including a plurality of OLED pixels, wherein the power consumed by the display is less than 6 mW/cm$^2$ when the display is operated at a luminance of at least 700 cd/m$^2$, excluding driving circuitry external to the active-matrix display.

Embodiments of the disclosed subject matter provide a device having an active-matrix driven display including a plurality of OLED pixels, wherein the power consumed by the display is divided by the luminance in cd/m$^2$ is less than 0.08 W/cd, excluding driving circuitry external to the active-matrix display.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
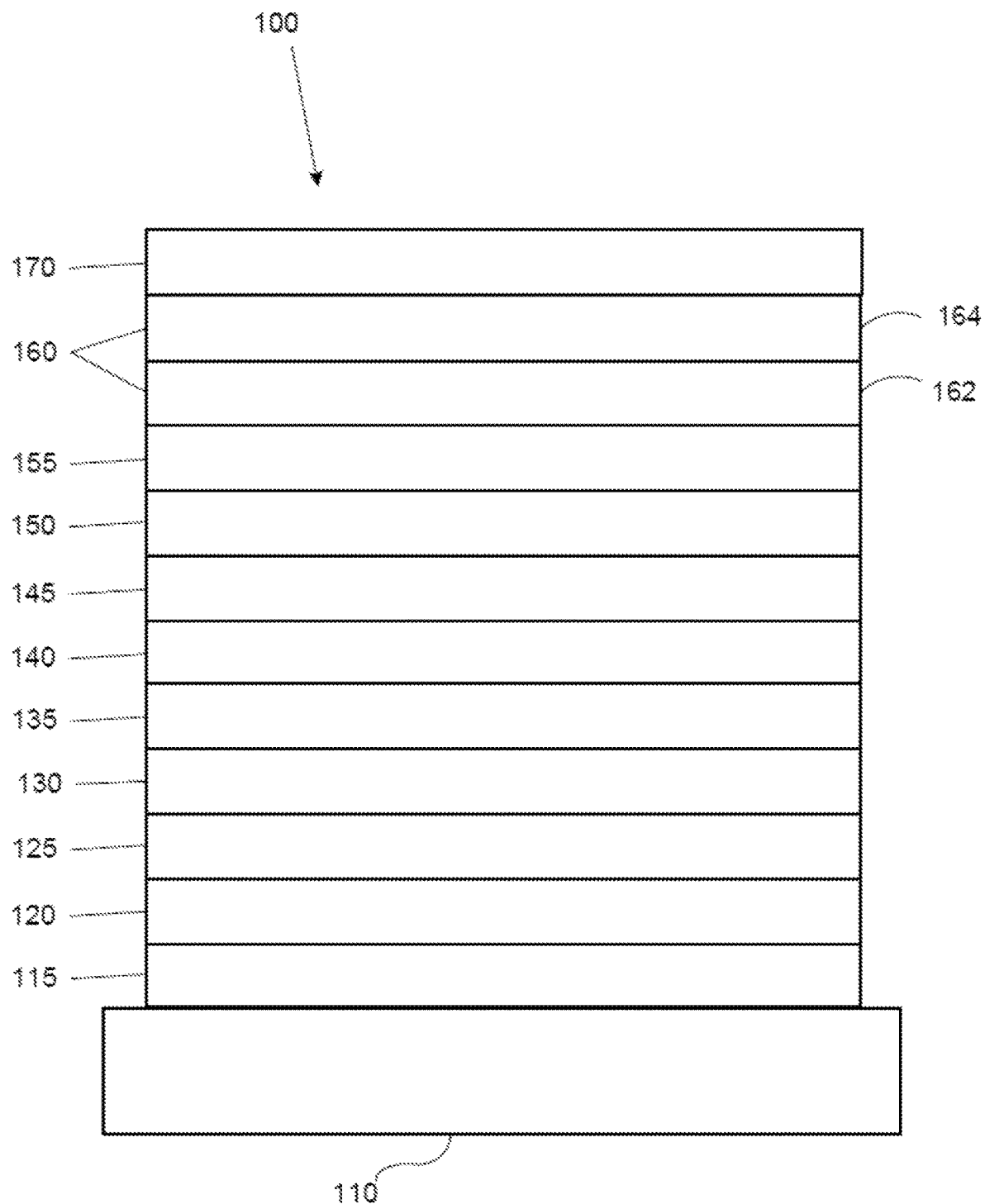
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
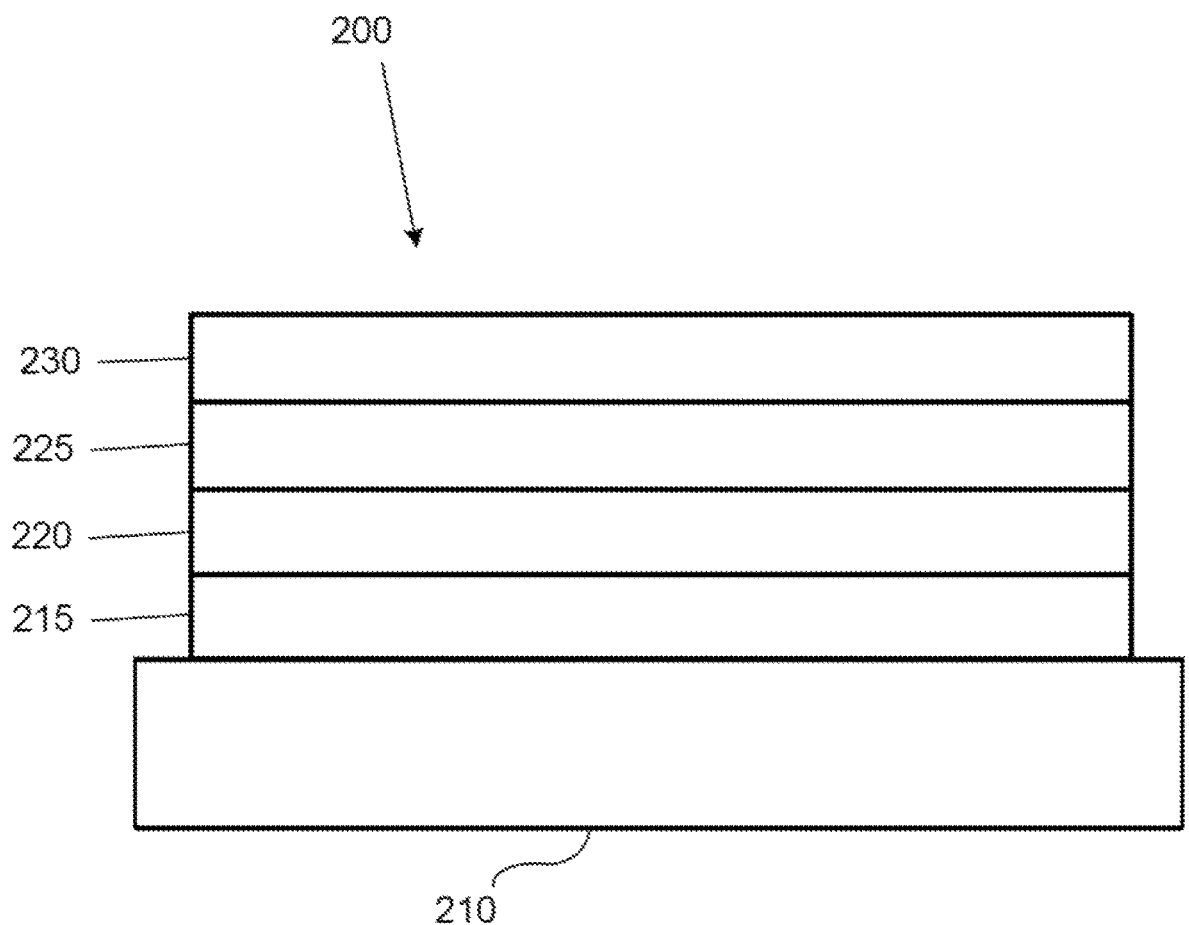
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, microdisplays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Current OLED displays for cell phones, tablets and TVs, generally use phosphorescent red and green emissive layers and deep blue emitting layers (EMLs), which can be fluorescent or phosphorescent. Wearable displays can, for example, have different usage and applications than cell phone displays and TVs. That is, wearable displays may generally display text based information (e.g., health based information) and exact color temperature of the display white point is less important than that of TV, tablet, and cell phone displays. According to embodiments of the disclosed subject matter, it is desirable to provide reduced power consumption OLED displays. In exemplary embodiments of the disclosed subject matter, reduced power consumption OLED displays are provided for wearable devices. The disclosed subject matters also provides OLED displays that are daylight readable. According to embodiments of the disclosed subject matter, the disclosed subject matter provides OLED displays in wearable devices that are operated outdoors. The wearable device including the display disclosed herein may have touch functionality (e.g., a touchscreen).

Embodiments of the disclosed subject matter provide a device having an active-matrix driven display including a plurality of OLED pixels, each OLED pixel including a first sub-pixel configured to emit light in the light blue range of the visible spectrum, where each pixel comprises no other sub-pixels that emit light in a blue range of the visible spectrum. Each of the plurality of OLED pixels may include a second sub-pixel configured to emit red light and a third sub-pixel configured to emit green light. The plurality of OLED sub-pixels may include a second sub-pixel configured to emit yellow light.

At least one color change layer can be disposed over the second sub-pixel. The color change layer may be a color filter or a color conversion layer. In the device disclosed herein, each of the plurality of OLED pixels can include a second sub-pixel configured to emit yellow light, and at least one color filter disposed over the second sub-pixel.

In embodiments of the disclosed subject matter, the plurality of OLED pixels may include an unpatterned white pixel that includes yellow and light blue emitters. One or more color changing layers may be disposed on yellow and light blue emitters to produce the display primary colors of red, green and blue. Alternatively, or in addition, the plurality of OLED pixels may include an unpatterned white pixel that includes red, green and light blue emitters, with one or more color changing layers disposed thereon, to produce the display primary colors of red, green and blue.

The first sub-pixel of the device disclosed herein can include a plurality of emissive regions arranged in a vertical stack. In embodiments of the disclosed subject matter, the first sub-pixel is phosphorescent. Alternatively, all of the plurality of OLED pixels are phosphorescent.

The plurality of sub-pixels is configured to emit light having a white point color temperature of less than 3000K. Alternatively, or in addition, the plurality of sub-pixels can be configured to emit light having a white point color temperature of less than 4000K. Alternatively, or in addition, the plurality of sub-pixels can be configured to emit light having a white point color temperature of less than 5000K. A selected white point can be within a 7-step, 3-step, or 1-step MacAdam ellipse of a Planckian Black Body Locus.

As discussed in detail below, the power consumed by the active-matrix driven display including the plurality of OLED pixels can be less than 6 $mW/cm^2$ when the display is operated at a luminance of at least 700 $cd/m^2$, excluding driving circuitry external to the active-matrix display. The power consumed by the active-matrix driven display including the plurality of OLED pixels is divided by the luminance in $cd/m^2$ is less than 0.08 W/cd, excluding driving circuitry external to the active-matrix display.

In embodiments of the disclosed subject matter, the light emitted in the light blue range has a y-coordinate of greater than 0.15 in CIE 1931 XYZ color space chromaticity. Alternatively, or in addition, the light emitted in the light blue range by the device can have a y-coordinate of greater than 0.2 in CIE 1931 XYZ color space chromaticity. Alternatively, or in addition, the light emitted in the light blue range can have a y-coordinate of greater than 0.25 in CIE 1931 XYZ color space chromaticity. Alternatively, or in addition, the light emitted in the light blue range by the device can have a y-coordinate of greater than 0.3 in CIE 1931 XYZ color space chromaticity.

In embodiments of the disclosed subject matter, when the device is to provide luminances above a predetermined threshold level, any increase in luminance may use at least a greater proportion of red light to the light in the light blue range than used for a corresponding luminance increase below the predetermined threshold level. When the device is to provide luminances above a predetermined threshold level, any increase in luminance may use at least a greater proportion of green light to the light in the light blue range than used for a corresponding luminance increase below the predetermined threshold level. When the device is to provide luminances above a predetermined threshold level, any increase in luminance may use at least a greater proportion of yellow light to the light in the light blue range than used for a corresponding luminance increase below the predetermined threshold level.

In embodiments of the disclosed subject matter, and as discussed in detail below, each of the plurality of pixels of the device may include a solar cell configured to power at least a portion of the plurality of OLED pixels of the device. The device may include a plurality of solar cells, where the area of solar cells is less than 50% of an active area of the active-matrix driven display including the plurality of OLED pixels. In embodiments of the disclosed subject matter, the plurality of OLED pixels can be disposed adjacent to a plurality of solar cells. Alternatively, the plurality of solar cells can capture at least light transmitted through the active-matrix driven display.

The active-matrix driven display of the device disclosed herein can be flexible, transparent, or conformable. The device can be a wearable device, a watch, a computer, a health monitor, a head mounted display, virtual reality glasses, smart glasses, or a communication device. The wearable device including the display disclosed herein may have touch functionality (e.g., a touchscreen). The active-matrix driven display of the device disclosed herein having the plurality of OLED pixels can be a three-dimensional (3D) display.

The device disclosed herein can be powered by motion, wireless power, or thermal energy. In the device disclosed herein, a plurality of solar cells can be integrated with the plurality of OLED pixels in the active-matrix driven display, where the energy received from the solar cells can be converted to power the device.

The device disclosed herein can include an organic thin film transistor (TFT) backplane to control the active-matrix driven display including the plurality of OLED pixels. Conventional active-matrix backplane TFT technologies such as amorphous silicon, poly-silicon and oxide transistors could be used to control the active-matrix driven display.

Embodiments of the disclosed subject matter provide an all phosphorescent display system including red, green and light blue sub pixels. The reduced power consumption of the display can provide daylight readability.

The disclosed subject matter can be used to produce a reduced power consumption (e.g., very low power consumption) OLED display, at reduced cost, for wearable devices and other display applications, where rigorous image quality is not required. The displays according to exemplary embodiments of the disclosed subject matter are daylight readable (e.g., readable in sunlight), and display images and video, can be configured to minimize and/or reduce heat, and be made of a material, such as plastic, so as to be flexible, transparent, and/or conformable (e.g., when used in a wearable device).

According to embodiments of the disclosed subject matter, OLED displays can show text using black background at less power than a comparable liquid crystal display (LCD). In particular, if OLEDs show saturated monochrome colors, power can be reduced relative to similar operation of an LCD. That is, as OLED displays may only use one sub-pixel of an illuminated pixel, whereas LCD uses backlight behind every pixel and sub-pixel, whatever the image, the power requirements for an OLED may be substantially reduced from a comparative LCD.

Cell phone displays and TVs are designed to show white backgrounds because of the subject matter of the images to be displayed, and current content conventions, such as a white background that is typically found in many documents and internet pages.

Wearable displays, which may be reduced in size from conventional displays, can deliver information-based content (e.g., text content, icon content, or the like) while displays having an increased size, such as those found on smart phones, tablets and TVs, may be typically directed to represent and reproduce real-life pictures (e.g., in images or video), which can require cooler white points.

The image quality requirements of wearable devices, that include the features of the illustrative embodiments as disclosed herein, which may typically display different content having different attributes, allow for different display architectures and fabrication techniques than are currently used. For example, using a display based on a warmer white point than current mobile displays and TVs, devices having the features of the disclosed subject matter can have an all-phosphorescent emissive layer system, using red, green and light blue emissive layer systems. Power consumption can be reduced by using the phosphorescent (light) blue. A wearable device, including a display according to the disclosed subject matter, may have reduced power consumption, as it may display text (e.g., on a black background) more efficiently than currently used displays. That is, displays that include phosphorescent (light) blue sub-pixel elements and that are directed to displaying text can consume less power than equivalent LCDs.

In example embodiments of the disclosed subject matter, reduced power consumption and reduced resolution of wearable displays can allow for lower cost fabrication techniques. For example, in a display device, yellow and blue sub-pixels may be used with two color filters so as to simplify and reduce the cost of OLED deposition. That is, the fabrication of such a display device only uses two lower resolution masking operations. Organic vapor jet printing (OVJP) is another deposition technique that could be used to reduce the cost of fabricating displays, such as those disclosed herein.

The reduced power consumption of a display according to the embodiments of the disclosed subject matter herein provides for daylight readability, as the power disclosed display at daylight readable brightness levels (e.g. 700 cd/m$^2$) could be comparable to current OLED displays at for example, 430 cd/m$^2$. When the display luminance is increased above a predetermined brightness (e.g. 300 cd/m$^2$), only red and green pixels may be made brighter because, in bright background illumination, the eye is more sensitive to contrast than color.

Embodiments of the present invention may provide sufficient power by using multiple modes of operation. Generally, one mode of operation may be used when a high-brightness display is required, and/or when the device is in "active" use by a user, such as when the user is accessing information on the device, providing input to the device, or the like. In contrast, a second mode of operation may be used when the device is not in active use, such as when it is being worn by a user and may be operable to receive information, alerts, or the like, but is not being directly viewed or manipulated by the user. Alternatively or in addition, one mode of operation may be used when the device determines that a relatively high brightness is required for the display to be easily readable by a user, and another mode may be used when a lower brightness is sufficient.

For example, in normal brightness use, such as at 500 nits or less, the display may be operated in a first mode, which may be a relatively low-power mode. When a higher brightness is needed, such as because the ambient light level is higher, the device may enter a high-brightness mode that operates at, for example, 500 nits or more. As a specific example, it is generally accepted that in an environment with relatively bright sunlight, contrast is more important than color reproduction for display readability. Thus, when the device enters a high-brightness mode due to a higher ambient light level, the brightness of colors in the region of maximum sensitivity of the human eye may be increased to provide increased contrast with little or no increase in the power required by the display. More specifically, the brightness of the display in or near the green region of the visible spectrum may be increased relative to other regions of the visible spectrum. The ambient light level may be set by a user, or may be detected by a sensor such as a light sensor incorporated into the device. By adjusting the color balance in a high-brightness environment, devices as disclosed herein may provide improved lifetime and/or lower maximum power requirements. The lifetime of the OLED display also may be extended, since the level and amount of current provided to other components, such as blue-emitting components of the OLED, may be limited in high brightness applications.

Lower power consumption may also indicate that a device containing the display having an architecture as disclosed herein can be charged less often than a regular device (e.g., a device having conventional OLED display or having an AMLCD display). The devices disclosed herein may include rechargeable batteries to provide power for the devices. In embodiments of the disclosed subject matter, devices may be charged wirelessly, such as by solar power or other wireless charging (e.g., via electromagnetic or sound waves).

If wireless charging for wearable devices is limited to less than 1 Watt, efficiency of wireless charging may depend upon the size of radii of charging and receiving coils and charging distance. From U.S. Pat. No. 8,400,018, a figure of merit can be defined for wireless power transfer using highly coupled resonant source and loads. The coupling to loss factor CL can be written as proportional to:

$$CL \text{ proportional to } \left(\frac{\sqrt{r_1 r_2}}{D}\right)^3 \quad \text{equation (1)}$$

where D is distance between source and load and $r_1$ and $r_2$ are the respective radii of the coils used to transmit and receive power. That is, $r_1$ is the radius of the coil to transmit power, and $r_2$ is the radius of the coil to receive power at the wearable device. In general, CL>1 may be preferred for good power transfer, leading to D/r in the range of less than 3 to 10 when $r_1$ is equal to $r_2$. As most wearable devices will be a small, the coil radii will be small (e.g., the radius of the coil may be between 0.5 cm and 2.0 cm). Assuming r1 is 10 cm and $r_2$ is 1 cm, then D<3 cm for CL>1. Accordingly, the wearable device may be removed from the body and placed close to a wireless charging station for charging. The lower power consumption of the OLED display as disclosed herein could be configured for less efficient charging, and therefore greater charging distances. For example, if the charging is 50% efficient, then for a 1 W source, the device can receive 500 mW, or approximately 10 times the power consumed by the display. For example, if the display is used 2.5 hours per day (on average), then the device may be charged for 15 minutes per day to replenish the power used by the display.

A display device according to the embodiments disclosed herein may be solar powered and/or solar chargeable. For daylight readability in bright sunlight, the display disclosed herein may consume approximately 5.5 mW/cm$^2$, as opposed to 8.9 mW/cm$^2$ for a conventional OLED and greater than 17 mW/cm$^2$ for a conventional AMLCD. A typical 11% efficient thin film solar cell can produce approximately 11 mW/cm$^2$ of power under AM1.5 sunlight conditions. For example, if solar cells in the wearable device having a display as disclosed herein receives 50% of available sunlight, then the solar cells can produce approximately 5.5 mW/cm$^2$ of power, which can drive the OLED display. The reception of 50% of available sunlight can either because of 50% use of the surface area as a solar cell and 50% as OLED by dividing each pixel into two separate regions, as illustrated in FIG. 3A, or the solar cell is disposed behind the OLED so that light transmitted through the OLED can be captured by the solar cell as illustrated in FIG. 3B.

Figure 3A:
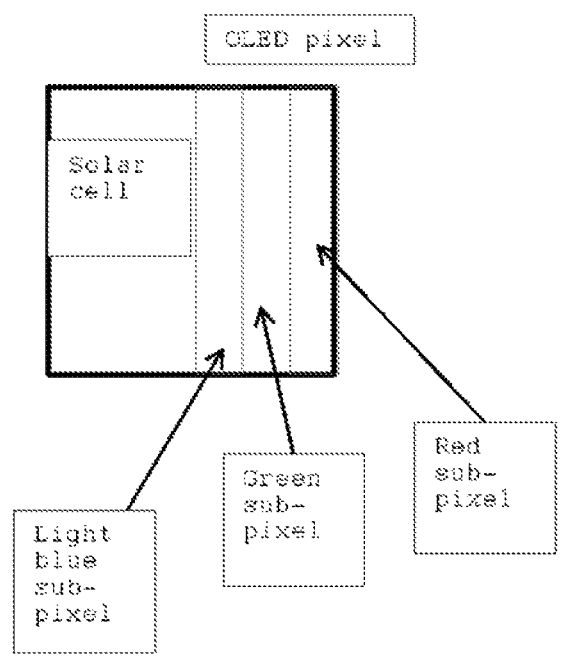
FIG. 3A shows an example of integration of solar cells into a display according to an implementation of the disclosed subject matter.
Figure 3B:
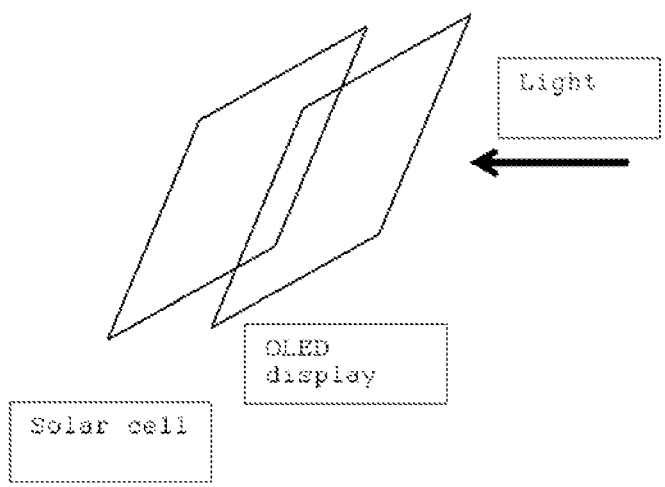
FIG. 3B shows another example of an integration of solar cells into a display according to an implementation of the disclosed subject matter.

Referring to FIG. 3A, a OLED pixel of a display as disclosed herein can include a red sub-pixel, a green sub-pixel, and a light blue sub-pixel which are disposed adjacent to a solar cell. That is, the OLED pixel may be divided into separate regions, where a first region includes one or more solar cells, and a second region includes the red, green, and light blue sub-pixels. Referring to FIG. 3B, a display as disclosed herein may be configured so as to have one or more solar cells disposed such that light transmitted through the OLED display can be captured by the one or more solar cells.

In exemplary embodiments of the disclosed subject matter, the solar cells could be separate from the display. That is, if the wearable device is a watch, the solar cells could be, for example, embedded in the strap of the watch. If the device is smart glasses, then the solar cells could be embedded in the sides or frame of the glasses. As display devices as disclosed herein may have reduced power consumption (e.g., lower power consumption), the display may have less area than would typically be needed for solar cells. That is, the area of solar cells can be less than 50% of the active area of the display to fully power the display in sunlight with the OLED display being daylight readable.

The reduced resolution of wearable displays as disclosed herein can allow for reduced cost fabrication techniques. For example, forming yellow and blue light with two color filters can reduce the cost of OLED deposition, as a display device can be formed with this architecture with two lower resolution masking operations. That is, in such as display, the blue may be the same light blue as used in a RGB side-by-side architecture as disclosed herein, and the yellow me be selected such that its CIE lies on a straight line defined by the light blue sub-pixel and the white point. In such a display, the yellow may have increased red content than that which is used in a conventional yellow and deep blue, plus two color filter approach.

In exemplary embodiments, organic vapor jet printing (OVJP) is a deposition technique that can be used to form a display as disclosed herein to reduce the cost of manufacturing such displays.

The lower power consumption of the display disclosed herein may provide for daylight readability, as the power for the display at daylight readable brightness levels (e.g. 700 cd/m$^2$) may be comparable to current OLED displays at for example, 430 cd/m$^2$. Power consumption of the display device disclosed herein may be further reduced for daylight operation as discussed above, where devices may be capable of operating in two modes, one of which may be a lower-power and/or lower-brightness mode relative to the other. That is, once the display luminance is increased above a specific brightness, e.g. 300 cd/m$^2$, only red and green pixels may be made brighter, as in bright background illumination the eye is more sensitive to contrast than color. Displays for wearable applications, such as those disclosed herein, can have different performance requirements and characteristics to cell phone displays, tablets and TVs. Apart from reduced size and, in some embodiments, different resolution, features of displays of the present disclosure include, but are not limited to: reduced power consumption; flexibility and/or conformability; reduced thickness (e.g., thin), reduced weight (e.g., light weight), light-weight and flexible composition; reduced heat (e.g., so as to have a cool operation temperature); daylight readability (e.g., for outside use in sunlight); the capability of displaying video including full-motion video; reduced cost; and the capability of being powered from wireless power sources and/or from solar power.

The reduced size, different resolution, and different usage model from conventional cell phone displays and TVs also may allow for different architectures to achieve the above.

Devices fabricated in accordance with embodiments of the invention disclosed herein have a display white point for a wearable application that may be a warmer white than is typically used for a mobile phone display, tablet or TV. Devices of the embodiments disclosed herein can have pixels that include red, green, and light blue sub-pixels, while omitting conventional deep blue sub-pixels. That is, devices fabricated in accordance with the embodiments of the disclosure herein have three (3) sub-pixels (e.g., red, green, and light blue), and include no other sub-pixels that emit blue visible light. Use of only a light blue sub-pixel can provide lower display power consumption and increased blue lifetime (e.g. blue sub-pixel lifetime) than making a conventional display (e.g., a display having D>6500K) with a deep blue sub-pixel. While it is preferable to use a phosphorescent light blue because of its increased efficiency, a fluorescent light blue could also be used to increase power savings, because of the lower color temperature of the display white point.

Devices fabricated in accordance with the embodiments of the invention produce a full color and/or near full color OLED display using three sub-pixels, which include red, green and light blue, where the white point is less than 5000K, and preferably 4000K or even 3000K. A selected white point can be within a 7-step, 3-step, or 1-step MacAdam ellipse of a Planckian Black Body Locus.

While exemplary embodiments disclosed herein provide a display with a three sub-pixel side-by-side configuration, the display could also be implemented in a RGBW (i.e., red, green blue, and white) configuration where the white includes red, green and light blue. The red, green, and blue colors of the display may be produced by disposing color filters or color altering layers on the white pixels. Alternatively, or in addition, the red, green, and blue colors of the display can be produced by disposing color filters or color altering layers on white OLEDs.

One or more of the optical films used to construct a display, or a device utilizing a display, are typically required to be transparent over the range of colors produced by the display. For example, the transparent conductors and touch panel components (if present), preferably have over 85% transmission over the visible spectrum. Many films typically absorb more light in the blue wavelengths than the red wavelengths, so different materials or compositions of materials can be used if one does not require them to be highly transmissive in deep blue. This may mean they could be made thicker, and still have good transmission from light blue wavelengths through red wavelengths, for example, thus improving the conductivity of transparent conductors.

Experimental

Display simulations were performed to compare the power consumption of an OLED display with two different light blues (0.16, 0.30) and (0.16, 0.25) and two different white points, D30 and D40 at a luminance of 500 cd/m$^2$. Results are shown in Tables 1A-4B. The results are compared to a conventional OLED display using a deep blue sub-pixel and an approximate D65 white point.

Tables 1A-1B relate to simulations of power consumption for OLED display using conventional RGB sub-pixels and a D65 white point with a display having a new architecture of red, green, and light blue (0.16, 0.30) and a D40 white point, according to the exemplary embodiments disclosed herein.

TABLE 1A

| Assumptions | | | | | |
|---|---|---|---|---|---|
| Green | 80 | cd/A | (0.30, 0.60) | | |
| Red | 35 | cd/A | (0.65, 0.35) | | |
| Blue | 5.5 | cd/A | (0.15, 0.08) | 938 | nits |
| Light Blue | 39 | cd/A | (0.16, 0.30) | 3,088 | nits |
| Pixl capacitance | 2.20E−08 | F/cm2 | | | |
| OLED Voltage | 3.58 | V | | | |
| Vth | 3.80 | V | | | |
| KuW/L | 1.00 | uA | | | |
| TFT Voltage | 3.42 | V | | | |
| Polarizer Efficiency | 44% | % | TFT + OLED= | 7.00 | V |
| RGB2 analysis | | | | | |
| Green component= | 62% | % | | | |
| Red component= | 27% | % | | | |
| Blue component= | 11% | % | 100.0% | | |
| D40 RGB1 analysis | | | | | |
| Green component= | 29% | % | | | |
| Red component= | 35% | % | | | |
| Blue component= | 36% | % | 100.0% | | |
| % pixel on | 60% | % | | | |
| Display Specs | | | | | |
| Width | 4.425 | cm | | 5.08 | 2.00 ins |
| Height | 2.49 | cm | | | |
| Brightness | 500 | cd/m2 | | | |
| Sub-pixel FF | 40% | % | | | |
| Refresh rate | 60 | Hz | | | |
| Display resolution | 100 | ppi | | | |
| Sub pixel area | 8.60E−05 | cm2 | | | |

Table 1A shows the assumptions for an OLED display using conventional RGB sub-pixels (blue CIE=(0.16, 0.08)) and a D65 white point, and an OLED display having the architecture disclosed herein, with red, green and light blue sub-pixels, and a D40 white point. The OLED display having the conventional RGB sub-pixels (e.g., the RGB2 analysis shown in Table 1A) has a green component of 62%, a red component 27%, and a blue component of 11%. The OLED display having the new architecture (e.g., the RGB1 analysis shown in Table 1A) disclosed herein that includes the light blue sub-pixel (CIE=(0.16, 0.30)) has a green component of 29%, a red component of 35%, and a blue component of 36%, for a D40 white point, as opposed to the D65 white point of the conventional RGB sub-pixel display.

which is a total power of 0.187 W. As used throughout the discussion of Tables 1A-4B, the red, green, and blue power is the combination of the OLED power and the thin film transistor (TFT) controller power. In contrast, the power for the new architecture OLED display has a green power of

TABLE 1B

CALCS

RGB2

| Green brightness= | 5,284 | | 8,523 | | | |
|---|---|---|---|---|---|---|
| Red brightness= | 2,301 | | | | | |
| Blue brightness= | 938 | | | | | |
| Green power | | 0.041 | W | Green OLED power= | 0.021 | W |
| Red power | | 0.041 | W | Red OLED power= | 0.021 | W |
| Blue power | | 0.105 | W | Blue OLED power= | 0.054 | W |
| Capactive power | 9.32E−05 | | | Capactive power= | 9.32E−05 | W |
| | | | | TFT power= | 0.091 | W |
| Total Power | | 0.187 | W | | 0.187 | W |
| | | 16.93 | mW/cm² | | | |

RGB1 D40

| Green brightness= | 2,469 | | 8,523 | | | |
|---|---|---|---|---|---|---|
| Red brightness= | 2,966 | | | | | |
| Blue brightness= | 3,088 | | | | | |
| Green power | | 0.019 | W | Green OLED power= | 0.010 | W |
| Red power | | 0.052 | W | Red OLED power= | 0.027 | W |
| Blue power | | 0.049 | W | Blue OLED power= | 0.025 | W |
| Capactive power | 0.00E+00 | | | Capactive power= | 0.00E+00 | W |
| | | | | TFT power= | 0.059 | W |
| Total Power | | 0.120 | W | | 0.120 | W |
| | | 10.91 | mW/cm² | | | |

Table 1B relates to simulations of power consumption for OLED display using conventional RGB sub-pixels and D65 white point with a display having a new architecture of red, green, and light blue (0.16, 0.30) and D40 white point, according to the exemplary embodiments disclosed herein. In the OLED display having the conventional sub-pixels, the green brightness is 5,284 cd/m², the red brightness is 2,301 cd/m², and the blue brightness is 938 cd/m². The OLED display having the architecture according to the exemplary embodiments disclosed herein has a green brightness of 2,469 cd/m², a red brightness of 2,966 cd/m², and a blue brightness of 3,088 cd/m². In the OLED display having the conventional RGB sub-pixels, the green power is 0.041 W, the red power is 0.041 W, and the blue power is 0.105 W, 0.019 W, a red power of 0.052 W, and a blue power of 0.049 W, for a total power of 0.120 W, which is less than the total power of 0.187 W of the conventional OLED display. Thus, although the total brightness values of the two displays are the same (i.e., 500 cd/m² overall), there is a reduction in blue optical power and electrical power for the blue OLED for the new architecture display, for a total reduction of power for the same total brightness.

Tables 2A-2B relate to simulations of power consumption for an OLED display using conventional RGB sub-pixels and a D65 white point with new architecture of RG and light blue (0.16, 0.30) and D30 white point.

TABLE 2A

| Assumptions | | | | |
|---|---|---|---|---|
| Green | 80 | cd/A | (0.30, 0.60) | |
| Red | 35 | cd/A | (0.65, 0.35) | |
| Blue | 5.5 | cd/A | (0.15, 0.08) | 938 nits |
| Light Blue | 39 | cd/A | (0.16, 0.30) | 1,551 nits |
| Pixl capacitance | 2.20E−08 | F/cm2 | | |
| OLED Voltage | 3.58 | V | | |
| Vth | 3.80 | V | | |
| KuW/L | 1.00 | uA | | |
| TFT Voltage | 3.42 | V | | |
| Polarizer Efficiency | 44% | % | TFT + OLED= | 7.00 V |
| RGB2 analysis | | | | |
| Green component= | 62% | % | | |
| Red component= | 27% | % | | |
| Blue component= | 11% | % | 100.0% | |
| D3 0 RGB1 analysis | | | | |
| Green component= | 40% | % | | |
| Red component= | 42% | % | | |

TABLE 2A-continued

| | | | | | |
|---|---|---|---|---|---|
| Blue component= | 18% | % | | 100.0% | |
| % pixel on | 60% | % | | | |
| | | | Display Specs | | |
| Width | 4.425 | cm | | 5.08 | 2.00 |
| Height | 2.49 | cm | | | |
| Brightness | 500 | cd/m2 | | | |
| Sub-pixel FF | 40% | % | | | |
| Refresh rate | 60 | Hz | | | |
| Display resolution | 100 | ppi | | | |
| Sub pixel area | 8.60E−05 | cm2 | | | |

Table 2A shows the assumptions for an OLED display using conventional RGB sub-pixels (blue CIE=(0.16, 0.08)) and D65 white point, and an OLED display having the architecture disclosed herein, with red, green and light blue sub-pixels, with a D30 white point. The OLED display having the conventional RGB sub-pixels (e.g., the RGB2 analysis shown in Table 2A) has a green component of 62%, a red component 27%, and a blue component of 11%. The OLED display having the new architecture (e.g., the RGB1 analysis shown in Table 2A) disclosed herein that includes the light blue sub-pixel (CIE=(0.16, 0.30)) has a green component of 40%, a red component of 42%, and a blue component of 18%, for a D30 white point, as opposed to the D65 white point of the conventional RGB sub-pixel display.

display having the architecture according to the exemplary embodiments disclosed herein with the light blue sub-pixel has a green brightness of 3,384 cd/m$^2$, a red brightness of 3,588 cd/m$^2$, and a blue brightness of 1,551 cd/m$^2$. In the OLED display having the conventional RGB sub-pixels, the green power is 0.041 W, the red power is 0.041 W, and the blue power is 0.105 W, which is a total power of 0.187 W. In contrast, the power for the new architecture OLED display has a green power of 0.026 W, a red power of 0.063 W, and a blue power of 0.025 W, for a total power of 0.114 W, which is less than the total power of 0.187 W of the conventional OLED display. Thus, although the total brightness values of the two displays are the same (i.e., 500 cd/m$^2$), there is a reduction in blue optical power and

TABLE 2B

| | | | | | |
|---|---|---|---|---|---|
| | | CALCS | | | |
| RGB2 | | | | | |
| Green brightness= | 5,284 | | 8,523 | | |
| Red brightness= | 2,301 | | | | |
| Blue brightness= | 938 | | | | |
| Green power | 0.041 | W | Green OLED power= | 0.021 | W |
| Red power | 0.041 | W | Red OLED power= | 0.021 | W |
| Blue power | 0.105 | W | Blue OLED power= | 0.054 | W |
| Capacitive power | 9.32E−05 | | Capacitive power= | 9.32E−05 | W |
| | | | TFT power= | 0.091 | W |
| Total Power | 0.187 | W | | 0.187 | W |
| | 16.93 | mW/cm$^2$ | | | |
| RGB1 | D30 | | | | |
| Green brightness= | 3,384 | | 8,523 | | |
| Red brightness= | 3,588 | | | | |
| Blue brightness= | 1,551 | | | | |
| Green power | 0.026 | W | Green OLED power= | 0.013 | W |
| Red power | 0.063 | W | Red OLED power= | 0.032 | W |
| Blue power | 0.025 | W | Blue OLED power= | 0.013 | W |
| Capacitive power | 0.00E+00 | | Capacitive power= | 0.00E+00 | W |
| | | | TFT power= | 0.056 | W |
| Total Power | 0.114 | W | | 0.114 | W |
| | 10.34 | mW/cm$^2$ | | | |

Table 2B relates to simulations of power consumption for OLED display using conventional RGB sub-pixels and D65 white point with a display having a new architecture of red, green, and light blue (0.16, 0.30) and D30 white point, according to the exemplary embodiments disclosed herein. In the OLED display having the conventional sub-pixels, the green brightness is 5,284 cd/m$^2$, the red brightness is 2,301 cd/m$^2$, and the blue brightness is 938 cd/m$^2$. The OLED electrical power for the blue OLED for the new architecture display, for a total reduction of power for the same total brightness.

Tables 3A-3B relate to simulations of power consumption for OLED display using conventional RGB sub-pixels and D65 white point with new architecture of RG and light blue (0.16, 0.25) and D30 white point.

TABLE 3A

| Assumptions | | | | | |
|---|---|---|---|---|---|
| Green | 80 | cd/A | (0.30, 0.60) | | |
| Red | 35 | cd/A | (0.65, 0.35) | | |
| Blue | 5.5 | cd/A | (0.15, 0.08) | 938 | nits |
| Light Blue | 35 | cd/A | (0.16, 0.25) | 1,155 | nits |
| Pixl capacitance | 2.20E−08 | F/cm2 | | | |
| OLED Voltage | 3.58 | V | | | |
| Vth | 3.80 | V | | | |
| KuW/L | 1.00 | uA | | | |
| TFT Voltage | 3.42 | V | | | |
| Polarizer Efficiency | 44% | % | TFT + OLED= | 7.00 | V |
| RGB2 analysis | | | | | |
| Green component= | 62% | % | | | |
| Red component= | 27% | % | | | |
| Blue component= | 11% | % | 100.0% | | |
| D30 RGB1 analysis | | | | | |
| Green component= | 45% | % | | | |
| Red component= | 41% | % | | | |
| Blue component= | 14% | % | 100.0% | | |
| % pixel on | 60% | % | | | |
| Display Specs | | | | | |
| Width | 4.425 | cm | | 5.08 | 2.00 ins |
| Height | 2.49 | cm | | | |
| Brightness | 500 | cd/m2 | | | |
| Sub-pixel FF | 40% | % | | | |
| Refresh rate | 60 | Hz | | | |
| Display resolution | 100 | ppi | | | |
| Sub pixel area | 8.60E−05 | cm2 | | | |

Table 3A shows the assumptions for an OLED display using conventional RGB sub-pixels (blue CIE=(0.16, 0.08)) and D65 white point, and an OLED display having the architecture disclosed herein, with red, green and light blue sub-pixels, with a D30 white point. The OLED display having the conventional RGB sub-pixels (e.g., the RGB2 analysis shown in Table 3A) has a green component of 62%, a red component 27%, and a blue component of 11%. The OLED display having the new architecture (e.g., the RGB1 analysis shown in Table 3A) disclosed herein that includes the light blue sub-pixel (CIE=(0.16, 0.30)) has a green component of 45%, a red component of 41%, and a blue component of 14%, for a D30 white point, as opposed to the D65 white point of the conventional RGB sub-pixel display.

TABLE 3B

| CALCS | | | | | | |
|---|---|---|---|---|---|---|
| RGB2 | | | | | | |
| Green brightness= | 5,284 | | 8,523 | | | |
| Red brightness= | 2,301 | | | | | |
| Blue brightness= | 938 | | | | | |
| Green power | 0.041 | W | | Green OLED power= | 0.021 | W |
| Red power | 0.041 | W | | Red OLED power= | 0.021 | W |
| Blue power | 0.105 | W | | Blue OLED power= | 0.054 | W |
| Capactive power | 9.32E−05 | | | Capactive power= | 9.32E−05 | W |
| | | | | TFT power= | 0.091 | W |
| Total Power | 0.187 | W | | | 0.187 | W |
| | 16.93 | mW/cm² | | | | |
| RGB1 | D30 | | | | | |
| Green brightness= | 3,842 | | 8,523 | | | |
| Red brightness= | 3,525 | | | | | |
| Blue brightness= | 1,155 | | | | | |
| Green power | 0.030 | W | | Green OLED power= | 0.015 | W |
| Red power | 0.062 | W | | Red OLED power= | 0.032 | W |
| Blue power | 0.020 | W | | Blue OLED power= | 0.010 | W |
| Capactive power | 0.00E+00 | | | Capactive power= | 0.00E+00 | W |
| | | | | TFT power= | 0.055 | W |
| Total Power | 0.112 | W | | | 0.112 | W |
| | 10.18 | mW/cm² | | | | |

Table 3B relates to simulations of power consumption for OLED display using conventional RGB sub-pixels and D65 white point with a display having a new architecture of red, green, and light blue (0.16, 0.25) and a D30 white point, according to the exemplary embodiments disclosed herein. In the OLED display having the conventional sub-pixels, the green brightness is 5,284 cd/m$^2$, the red brightness is 2,301 cd/m$^2$, and the blue brightness is 938 cd/m$^2$. The OLED display having the architecture according to the exemplary embodiments disclosed herein with the light blue sub-pixel has a green brightness of 3,842 cd/m$^2$, a red brightness of 3,525 cd/m$^2$, and a blue brightness of 1,155 cd/m$^2$. In the OLED display having the conventional RGB sub-pixels, the green power is 0.041 W, the red power is 0.041 W, and the blue power is 0.105 W, which is a total power of 0.187 W.

In contrast, the power for the new architecture OLED display has a green power of 0.030 W, a red power of 0.062 W, and a blue power of 0.020 W, for a total power of 0.112 W, which is less than the total power of 0.187 W of the conventional OLED display. Thus, although the total brightness values of the two displays are the same (i.e., 500 cd/m$^2$), there is a reduction in blue optical power and electrical power for the blue OLED for the new architecture display, for a total reduction of power for the same total brightness.

Table 4A-4B relate to simulations of power consumption for OLED display using conventional RGB sub-pixels and D65 white point with new architecture of RG and light blue (0.16, 0.25) and a D40 white point.

TABLE 4A

| Assumptions | | | | | |
|---|---|---|---|---|---|
| Green | 80 | cd/A | (0.30, 0.60) | | |
| Red | 35 | cd/A | (0.65, 0.35) | | |
| Blue | 5.5 | cd/A | (0.15, 0.08) | 938 | nits |
| Light Blue | 35 | cd/A | (0.16, 0.25) | 2,094 | nits |
| Pixl capacitance | 2.20E−08 | F/cm2 | | | |
| OLED Voltage | 3.58 | V | | | |
| Vth | 3.80 | V | | | |
| KuW/L | 1.00 | uA | | | |
| TFT Voltage | 3.42 | V | | | |
| Polarizer Efficiency | 44% | % | TFT + OLED= | 7.00 | V |
| RGB2 analysis | | | | | |
| Green component= | 62% | % | | | |
| Red component= | 27% | % | | | |
| Blue component= | 11% | % | 100.0% | | |
| D40 RGB1 analysis | | | | | |
| Green component= | 40% | % | | | |
| Red component= | 35% | % | | | |
| Blue component= | 25% | % | 100.0% | | |
| % pixel on | 60% | % | | | |
| Display Specs | | | | | |
| Width | 4.425 | cm | | 5.08 | 2.00 ins |
| Height | 2.49 | cm | | | |
| Brightness | 500 | cd/m2 | | | |
| Sub-pixel FF | 40% | % | | | |
| Refresh rate | 60 | Hz | | | |
| Display resolution | 100 | ppi | | | |
| Sub pixel area | 8.60E−05 | cm2 | | | |

Table 4A shows the assumptions for an OLED display using conventional RGB sub-pixels (blue CIE=(0.16, 0.08)) and D65 white point, and an OLED display having the architecture disclosed herein, with red, green and light blue sub-pixels, with a D40 white point. The OLED display having the conventional RGB sub-pixels (e.g., the RGB2 analysis shown in Table 4A) has a green component of 62%, a red component 27%, and a blue component of 11%. The OLED display having the new architecture (e.g., the RGB1 analysis shown in Table 4A) disclosed herein that includes the light blue sub-pixel (CIE=(0.16, 0.30)) has a green component of 40%, a red component of 35%, and a blue component of 25%, for a D40 white point, as opposed to the D65 white point of the conventional RGB sub-pixel display.

TABLE 4B

| CALCS | | |
|---|---|---|
| RGB2 | | |
| Green brightness= | 5,284 | 8,523 |
| Red brightness= | 2,301 | |
| Blue brightness= | 938 | |

TABLE 4B-continued

| CALCS | | | | |
|---|---|---|---|---|
| Green power | 0.041 W | Green OLED power= | 0.021 | W |
| Red power | 0.041 W | Red OLED power= | 0.021 | W |
| Blue power | 0.105 W | Blue OLED power= | 0.054 | W |
| Capactive power | 9.32E−05 | Capactive power= | 9.32E−05 | W |
| | | TFT power= | 0.091 | W |
| Total Power | 0.187 W | | 0.187 | W |
| | 16.93 mW/cm² | | | |
| RGB1 | D40 | | | |
| Green brightness= | 3,425 | 8,523 | | |
| Red brightness= | 3,003 | | | |
| Blue brightness= | 2,094 | | | |
| Green power | 0.026 W | Green OLED power= | 0.014 | W |
| Red power | 0.053 W | Red OLED power= | 0.027 | W |
| Blue power | 0.037 W | Blue OLED power= | 0.019 | W |
| Capactive power | 0.00E+00 | Capactive power= | 0.00E+00 | W |
| | | TFT power= | 0.057 | W |
| Total Power | 0.116 W | | 0.116 | W |
| | 10.55 mW/cm² | | | |

Table 4B relates to simulations of power consumption for OLED display using conventional RGB sub-pixels and D65 white point with a display having a new architecture of red, green, and light blue (0.16, 0.25) and a D40 white point, according to the exemplary embodiments disclosed herein. In the OLED display having the conventional sub-pixels, the green brightness is 5,284 cd/m², the red brightness is 2,301 cd/m², and the blue brightness is 938 cd/m². The OLED display having the architecture according to the exemplary embodiments disclosed herein with the light blue sub-pixel has a green brightness of 3,425 cd/m², a red brightness of 3,003 cd/m², and a blue brightness of 2,094 cd/m². In the OLED display having the conventional RGB sub-pixels, the green power is 0.041 W, the red power is 0.041 W, and the blue power is 0.105 W, which is a total power of 0.187 W. In contrast, the power for the new architecture OLED display has a green power of 0.026 W, a red power of 0.053 W, and a blue power of 0.037 W, for a total power of 0.116 W, which is less than the total power of 0.187 W of the conventional OLED display. Thus, although the total brightness values of the two displays are the same (i.e., 500 cd/m²), there is a reduction in blue optical power and electrical power for the blue OLED for the new architecture display, for a total reduction of power for the same total brightness.

TABLE 5

| Blue CIE | White point | Power (mW) | Blue luminance (nits) |
|---|---|---|---|
| (0.16, 0.30) | D30 | 114 | 1551 |
| (0.16, 0.30) | D40 | 120 | 3088 |
| (0.16, 0.25) | D30 | 112 | 1155 |
| (0.16, 0.25) | D40 | 116 | 2094 |

Table 5 shows display power consumption for 500 cd/m² for the above parameters (i.e., blue CIE, white point, power (mW), and blue luminance (nits)) at 60% on-time of white color rendering. A conventional display with deep blue typically consumes 187 mW. In contrast, a comparable AMLCD consumes 135 mW.

Table 5 compares results of four simulations, which are different combinations of blue CIE, white point, and power (mW) values that produce blue luminance (nits) values. Power consumption is reduced approximately 38% compared to conventional OLED display. Lifetime of phosphorescent light blue is increased over deep blue (e.g., the lifetime of the phosphorescent light blue is much longer than the deep blue), so the architecture of devices according to the exemplary embodiments of the present invention can have the efficiency of phosphorescent blue, without requiring increased lifetime deep phosphorescent blue (e.g., long lifetime deep phosphorescent blue). Table 5 also shows the luminance requirements for the light blue sub-pixel, as these will determine blue sub-pixel lifetimes. That is, the lower the luminance value, the longer the sub-pixel lifetime.

TABLE 6

| Display Type at 500 cd/m² | Power (mW) | Power density (mW/cm²) |
|---|---|---|
| Conventional OLED | 70 | 6.4 |
| New architecture OLED | 43 | 3.9 |
| AMLCD | 135 | 12.3 |

Referring to Table 6, power consumption (and power density equals power consumption divided by active display area) for three different display types based on assumed usage for a two-inch wearable sized display based on an average luminance of 500 cd/m² and the following usage scenario: (1) 25% of on-time showing full screen information with 60% display showing white; and (2) 75% of on-time showing white text with 10% display showing white.

Table 6 shows the contrast in power consumption between a conventional D65 OLED display, a display having the new architecture with the light blue sub-pixel (where the average of results are shown in Table 5), and an AMLCD display at an equivalent effective brightness, for a usage model for a wearable device where 25% of the on-time of the display is showing full screen information with 60% display showing white, and 75% of on-time of the display is showing white text with 10% display showing white. As shown in Table 6, the new architecture display provides a 70% power reduction compared to AMLCD, thus increasing the suitability of the new architecture for wearable devices.

TABLE 7

| Display Type at 700 cd/m² | Power (mW) | Power density (mW/cm²) |
|---|---|---|
| Conventional OLED | 98 | 8.9 |
| New architecture OLED | 60 | 5.5 |
| AMLCD | 189 | 17.2 |

As shown in Table 7, power consumption (where power density is equal to power consumption divided by active display area) for three different display types (e.g., conventional OLED, the new architecture OLED display as disclosed herein, and based on assumed usage for a two-inch wearable sized display based on an average luminance of 700 cd/m² and the following usage scenario: (1) 25% of on-time showing full screen information with 60% display showing white; and (2) 75% of on-time showing white text with 10% display showing white.

Table 7 shows similar results to Table 6, but at a daylight readable luminance of 700 cd/m². The new display architecture as disclosed herein can enable a wearable OLED display to be daylight readable (e.g., 700 cd/m²) for the same power consumption as a conventional display at 430 cd/m².

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
an active-matrix driven display including a plurality of OLED pixels, each OLED pixel comprising:
not more than three sub-pixels, wherein each of the not more than three sub-pixels is a phosphorescent sub-pixel, and wherein a first sub-pixel of the not more than three sub-pixels is configured to emit blue light in a light blue range of the visible spectrum having a peak emission wavelength in the range of 465-500 nm, a second sub-pixel is configured to emit red light in a red light range of the visible spectrum having a peak emission wavelength in the range of 580-700 nm, and a third sub-pixel is configured to emit green light in a green light range of the visible spectrum having a peak emission wavelength of 500-600 nm,
wherein each sub-pixel of the plurality of OLED pixels that is capable of emitting blue light only emits blue light in the light blue range, and wherein each pixel comprises no other sub-pixels that emit blue light, and
wherein the plurality of sub-pixels is configured to emit light having a white point color temperature selected from the group consisting of: less than 3000K, less than 4000K, and less than 5000K.

2. The device of claim 1, wherein each of the plurality of OLED pixels further comprises a second sub-pixel configured to emit red light and a third sub-pixel configured to emit green light.

3. The device of claim 2, wherein when the device is to provide luminances above a predetermined threshold level, and any increase in luminance uses at least a greater proportion of green light to the light in the light blue range than used for a corresponding luminance increase below the predetermined threshold level.

4. The device of claim 1, wherein the plurality of OLED sub-pixels further comprises a second sub-pixel configured to emit yellow light.

5. The device of claim 4, wherein when the device is to provide luminances above a predetermined threshold level, and any increase in luminance uses at least a greater proportion of yellow light to the light in the light blue range than used for a corresponding luminance increase below the predetermined threshold level.

6. The device of claim 4, further comprising at least one color change layer disposed over the second sub-pixel, the color change layer selected from the group consisting of: a color filter and a color conversion layer.

7. The device of claim 1, wherein the device comprises a wearable device, a watch, a computer, a health monitor, a head mounted display, virtual reality glasses, smart glasses, or a communication device.

8. The device of claim 1, wherein a selected white point is within a 7-step, 3-step, or 1-step MacAdam ellipse of a Planckian Black Body Locus.

9. The device of claim 1, wherein the power consumed by the active-matrix driven display including the plurality of OLED pixels is less than 6 mW/cm² when the display is operated at a luminance of at least 700 cd/m², excluding driving circuitry external to the active-matrix display.

10. The device of claim 1, wherein the power consumed by the active-matrix driven display including the plurality of OLED pixels is divided by the luminance in cd/m² is less than 0.08 W/cd, excluding driving circuitry external to the active-matrix display.

11. The device of claim 1, wherein the light emitted in the light blue range has a y-coordinate selected from the group consisting of: greater than 0.15 in CIE 1931 XYZ color space chromaticity, greater than 0.2 in CIE 1931 XYZ color space chromaticity, greater than 0.25 in CIE 1931 XYZ color space chromaticity, and greater than 0.3 in CIE 1931 XYZ color space chromaticity.

12. The device of claim 1, wherein when the device is to provide luminances above a predetermined threshold level, and any increase in luminance uses at least a greater proportion of red light to the light in the light blue range than used for a corresponding luminance increase below the predetermined threshold level.

13. The device of claim 1, wherein each of the plurality of pixels includes a solar cell configured to power at least a portion of the plurality of OLED pixels of the device.

14. The device of claim 1, further comprising a plurality of solar cells, wherein the area of solar cells is less than 50% of an active area of the active-matrix driven display including the plurality of OLED pixels.

15. The device of claim 1, wherein the active-matrix driven display including the plurality of OLED pixels is disposed adjacent to a plurality of solar cells.

16. The device of claim 1, wherein each of the plurality of OLED pixels further comprises:
a second sub-pixel configured to emit yellow light; and
at least one color filter disposed over the second sub-pixel.

17. The device of claim 1, wherein the active-matrix driven display including the plurality of OLED pixels comprises a three-dimensional (3D) display.

18. A device comprising:
an active-matrix driven display including a plurality of OLED pixels, each OLED pixel comprising:
not more than four sub-pixels, wherein each of the not more than four sub-pixels is a phosphorescent sub-pixel, comprising:
a first sub-pixel configured to emit blue light in a light blue range of the visible spectrum having a peak emission wavelength in the range of 465-500 nm,
a second sub-pixel configured to emit red light in a red light range of the visible spectrum having a peak emission wavelength in the range of 580-700 nm;
a third sub-pixel configured to emit green light in a green light range of the visible spectrum having a peak emission wavelength of 500-600 nm; and
a fourth sub-pixel configured to emit yellow light in a yellow light range of the visible spectrum having a peak emission wavelength of 540-600 nm,
wherein each sub-pixel of the plurality of OLED pixels that is capable of emitting blue light only emits blue light in the light blue range, and wherein each pixel comprises no other sub-pixels that emit blue light, and
wherein the plurality of sub-pixels is configured to emit light having a white point color temperature selected from the group consisting of: less than 3000K, less than 4000K, and less than 5000K.

19. A device comprising:
an active-matrix driven display including a plurality of OLED pixels, each OLED pixel comprising:
not more than three sub-pixels, wherein each of the not more than three sub-pixels is a phosphorescent sub-pixel, and wherein a first sub-pixel of the not more than three sub-pixels is configured to emit blue light in a light blue range of the visible spectrum having a y-coordinate greater than 0.15 in CIE 1931 XYZ color space chromaticity, wherein a second sub-pixel of the not more than three sub-pixels is configured to emit red light in a red light range of the visible spectrum having a peak emission wavelength in the range of 580-700 nm, and wherein a third sub-pixel of the not more than three sub-pixels is configured to emit green light in a green light range of the visible spectrum having a peak emission wavelength of 500-600 nm,
wherein each sub-pixel of the plurality of OLED pixels that is capable of emitting blue light only emits blue light in the light blue range, and wherein each pixel comprises no other sub-pixels that emit blue light, and
wherein the plurality of sub-pixels is configured to emit light having a white point color temperature selected from the group consisting of: less than 3000K, less than 4000K, and less than 5000K.

20. The device of claim 19, wherein each of the plurality of OLED pixels further comprises a second sub-pixel configured to emit red light and a third sub-pixel configured to emit green light.

21. The device of claim 20, wherein when the device is to provide luminances above a predetermined threshold level, and any increase in luminance uses at least a greater proportion of green light to the light in the light blue range than used for a corresponding luminance increase below the predetermined threshold level.

22. The device of claim 19, wherein the plurality of OLED sub-pixels further comprises a second sub-pixel configured to emit yellow light.

23. The device of claim 22, wherein when the device is to provide luminances above a predetermined threshold level, and any increase in luminance uses at least a greater proportion of yellow light to the light in the light blue range than used for a corresponding luminance increase below the predetermined threshold level.

24. The device of claim 22, further comprising at least one color change layer disposed over the second sub-pixel, the color change layer selected from the group consisting of: a color filter and a color conversion layer.

25. The device of claim 19, wherein the device comprises a wearable device, a watch, a computer, a health monitor, a head mounted display, virtual reality glasses, smart glasses, or a communication device.

26. The device of claim 19, wherein a selected white point is within a 7-step, 3-step, or 1-step MacAdam ellipse of a Planckian Black Body Locus.

27. The device of claim 19, wherein the power consumed by the active-matrix driven display including the plurality of OLED pixels is less than 6 mW/cm$^2$ when the display is operated at a luminance of at least 700 cd/m$^2$, excluding driving circuitry external to the active-matrix display.

28. The device of claim 19, wherein the power consumed by the active-matrix driven display including the plurality of OLED pixels is divided by the luminance in cd/m$^2$ is less than 0.08 W/cd, excluding driving circuitry external to the active-matrix display.

29. The device of claim 19, wherein the y-coordinate is selected from the group consisting of: greater than 0.2 in CIE 1931 XYZ color space chromaticity, greater than 0.25 in CIE 1931 XYZ color space chromaticity, and greater than 0.3 in CIE 1931 XYZ color space chromaticity.

30. The device of claim 19, wherein when the device is to provide luminances above a predetermined threshold level, and any increase in luminance uses at least a greater proportion of red light to the light in the light blue range than used for a corresponding luminance increase below the predetermined threshold level.

31. The device of claim 19, wherein each of the plurality of pixels includes a solar cell configured to power at least a portion of the plurality of OLED pixels of the device.

32. The device of claim 19, further comprising a plurality of solar cells, wherein the area of solar cells is less than 50% of an active area of the active-matrix driven display including the plurality of OLED pixels.

33. The device of claim 19, wherein the active-matrix driven display including the plurality of OLED pixels is disposed adjacent to a plurality of solar cells.

34. The device of claim 19, wherein each of the plurality of OLED pixels further comprises:
a second sub-pixel configured to emit yellow light; and
at least one color filter disposed over the second sub-pixel.

35. The device of claim 19, wherein the active-matrix driven display including the plurality of OLED pixels comprises a three-dimensional (3D) display.

36. A consumer product comprising a device comprising:
an active-matrix driven display including a plurality of OLED pixels, each OLED pixel comprising:
not more than three sub-pixels, wherein each of the not more than three sub-pixels is a phosphorescent sub-pixel, and wherein a first sub-pixel of the not more than three sub-pixels is configured to emit blue light in a light blue range of the visible spectrum having a y-coordinate greater than 0.15 in CIE 1931 XYZ color space chromaticity, wherein a second sub-pixel of the not more than three sub-pixels is configured to emit red light in a red light range of the visible spectrum having a peak emission wavelength in the range of 580-700 nm, and wherein a third sub-pixel of the not more than three sub-pixels is configured to emit green light in a green light range of the visible spectrum having a peak emission wavelength of 500-600 nm, wherein each sub-pixel of the plurality of OLED pixels that is capable of emitting blue light only emits blue light in the light blue range, and wherein each pixel comprises no other sub-pixels that emit blue light, and wherein the plurality of sub-pixels is configured to emit light having a white point color temperature selected from the group consisting of: less than 3000K, less than 4000K, and less than 5000K.

37. The consumer product of claim 36, wherein the consumer product is selected from the group consisting of: a flat panel display, a computer monitor, a medical monitor, a television, a billboard, a light for interior or exterior illumination and/or signaling, a heads-up display, a fully or partially transparent display, a flexible display, a laser printer, a telephone, a mobile phone, a tablet, a phablet, a personal digital assistant (PDA), a wearable device, a laptop computer, a digital camera, a camcorder, a viewfinder, a micro-display less than 2 inches in diagonal, a 3-D display, a virtual reality or augmented reality display, a vehicle, a video wall comprising multiple displays tiled together, a theater or stadium screen, and a sign.

\* \* \* \* \*